(12) United States Patent
Mittal et al.

(10) Patent No.: US 9,261,560 B2
(45) Date of Patent: Feb. 16, 2016

(54) HANDLING SLOWER SCAN OUTPUTS AT OPTIMAL FREQUENCY

(71) Applicant: Texas Instruments Incorporated, Dallas, TX (US)

(72) Inventors: Rajesh Kumar Mittal, Bangalore (IN); Mudasir Shafat Kawoosa, Srinagar (IN); Sreenath Narayanan Potty, Trivandrum (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/145,293

(22) Filed: Dec. 31, 2013

(65) Prior Publication Data

US 2015/0185283 A1 Jul. 2, 2015

(51) Int. Cl.
*G01R 31/3183* (2006.01)
*G01R 31/3177* (2006.01)
*G01R 31/317* (2006.01)
*G01R 31/3185* (2006.01)

(52) U.S. Cl.
CPC .... *G01R 31/318335* (2013.01); *G01R 31/3177* (2013.01); *G01R 31/31725* (2013.01); *G01R 31/318547* (2013.01); *G01R 31/31727* (2013.01)

(58) Field of Classification Search
CPC ............... G01R 31/3177; G01R 31/31725; G01R 31/3176; G01R 31/31727; G01R 31/31721; G01R 31/318335; G01R 31/31726; G01R 31/318547
USPC .......................... 714/726, 727, 729, 731, 732
See application file for complete search history.

(56) References Cited

U.S. PATENT DOCUMENTS

| | | | | |
|---|---|---|---|---|
| 5,663,966 A * | 9/1997 | Day et al. | ...... | 714/731 |
| 6,694,467 B2 * | 2/2004 | Whetsel | ...... | 714/729 |
| 6,725,391 B2 * | 4/2004 | Swoboda | ...... | 713/500 |
| 6,763,488 B2 * | 7/2004 | Whetsel | ...... | 714/729 |
| 6,766,487 B2 * | 7/2004 | Saxena et al. | ...... | 714/726 |
| 7,404,126 B2 * | 7/2008 | Jain et al. | ...... | 714/726 |
| 7,877,656 B2 * | 1/2011 | Rajski et al. | ...... | 714/729 |
| 8,127,188 B2 * | 2/2012 | Hasegawa | ...... | 714/731 |
| 8,464,117 B2 * | 6/2013 | Rakheja et al. | ...... | 714/731 |
| 8,726,112 B2 * | 5/2014 | Rajski et al. | ...... | 714/731 |

(Continued)

OTHER PUBLICATIONS

Li, Jia et al., "A Scan Chain Adjustment Technology for Test Power Reduction", Proc. 15th Asian Test Symposium IEEE Computer Society (2006).*

(Continued)

*Primary Examiner* — Cynthia Britt
(74) *Attorney, Agent, or Firm* — John Pessetto; Frank D. Cimino

(57) ABSTRACT

An embodiment provides a circuit for testing an integrated circuit. The circuit includes a scan compression architecture driven by a scan clock and generates M scan outputs, where M is an integer. A clock divider is configured to divide the scan clock by k to generate k number of phase-shifted scan clocks, where k is an integer. A packing logic is coupled to the scan compression architecture and generates kM slow scan outputs in response to the M scan outputs and the k number of phase shifted scan clocks. The packing logic further includes M number of packing elements. Each packing element includes k number of flip-flops. Each flip-flop of the k number of flip-flops receives a scan output of the M scan outputs and a phase-shifted scan clock of the k number of phase-shifted scan clocks, and generates a slow scan output of the kM slow scan outputs.

20 Claims, 6 Drawing Sheets

(56) References Cited

U.S. PATENT DOCUMENTS

| | | | |
|---|---|---|---|
| 9,057,763 B2* | 6/2015 | Wang et al. | |
| 2011/0167310 A1 | 7/2011 | Tung | |
| 2011/0307750 A1 | 12/2011 | Narayanan et al. | |
| 2012/0331362 A1 | 12/2012 | Tekumalla | |
| 2013/0159800 A1 | 6/2013 | Ravi et al. | |

OTHER PUBLICATIONS

Xiaodeng Zhang; Roy, K., "Power reduction in test-per-scan BIST," On-Line Testing Workshop, 2000. Proceedings. 6th IEEE International, vol., No., pp. 133,138, 2000.*

Whetsel, L., "Adapting scan architectures for low power operation," Test Conference, 2000. Proceedings. International, vol., No., pp. 863,872, 2000.*

* cited by examiner

HANDLING SLOWER SCAN OUTPUTS AT OPTIMAL FREQUENCY

TECHNICAL FIELD

Embodiments of the disclosure relate generally to scan testing of semiconductor devices such as integrated circuits (ICs).

BACKGROUND

Scan based techniques offer an efficient alternative to achieve high fault coverage compared to the functional pattern based testing. As the design size increases and multi-core SoCs (system-on-chip) becomes essential to drive high speed applications, test data volume and test application time grow unwieldy even in the highly efficient and balanced scan based designs. Scan compression technique is so far, the best technique for test data volume as well as test time reduction during pattern execution of scan inserted designs. Few compression techniques that are implemented in SoCs include broadcast or Illinois architecture, muxed and XOR architecture or MISR (multiple input shift register) based compression architecture. The problem in today's power consuming devices is to handle the leakage power. Efforts are made to use ultra-low leakage library (ULL) cells. A ULL cell library based IO (input/output) receives a scan input on an input terminal and generates a scan output on an output terminal. The ULL cell library based IOs have very high inertial delay on clock and data path at the output terminal that can go as high as the order of 30 ns. The input terminal of these IOs is not affected by this timing issue as the inertial delay between clock and data path is very low. Under such conditions, it is not possible to drive scan operation at higher frequency like 30 MHz or higher. Even though VLCT (very low cost tester) can support data to be driven at higher clock frequency but slower scan output is the bottle neck to the operation. As a result scan operation is not executed at optimal frequency resulting in higher test time.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a circuit for testing an integrated circuit. The circuit includes a scan compression architecture driven by a scan clock and generates M scan outputs, where M is an integer. A clock divider is configured to divide the scan clock by k to generate k number of phase-shifted scan clocks, where k is an integer. A packing logic is coupled to the scan compression architecture and generates kM slow scan outputs in response to the M scan outputs and the k number of phase shifted scan clocks. The packing logic further includes M number of packing elements and each packing element of the M number of packing elements receives a scan output of the M scan outputs. Each packing element includes k number of flip-flops and each flip-flop of the k number of flip-flops in a packing element receives a scan output of the M scan outputs. Each flip-flop receives a phase-shifted scan clock of the k number of phase-shifted scan clocks, such that each flip-flop generates a slow scan output of the kM slow scan outputs in response to the scan output and the phase-shifted scan clock.

Another embodiment provides a method of testing. k number of phase-shifted scan clocks is generated from a scan clock, where k is an integer. A packing logic generates kM slow scan outputs from M scan outputs. The packing logic includes M number of packing elements, where M is an integer. Each packing element of the M number of packing elements generates k slow scan output in response to a scan output of the M scan outputs and the k number of phase-shifted scan clocks.

Additionally, an embodiment provides a computing device. The computing device includes a processing unit, a plurality of logic circuits coupled to the processing unit and a testing circuit. The testing circuit is coupled to at least one logic circuit of the plurality of logic circuits. The testing circuit includes a scan compression architecture driven by a scan clock and generates M scan outputs, where M is an integer. A clock divider is configured to divide the scan clock by k to generate k number of phase-shifted scan clocks, where k is an integer. A packing logic is coupled to the scan compression architecture and generates kM slow scan outputs in response to the M scan outputs and the k number of phase shifted scan clocks. The packing logic further includes M number of packing elements and each packing element of the M number of packing elements receives a scan output of the M scan outputs. Each packing element includes k number of flip-flops and each flip-flop of the k number of flip-flops in a packing element receives a scan output of the M scan outputs. Each flip-flop receives a phase-shifted scan clock of the k number of phase-shifted scan clocks, such that each flip-flop generates a slow scan output of the kM slow scan outputs in response to the scan output and the phase-shifted scan clock.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
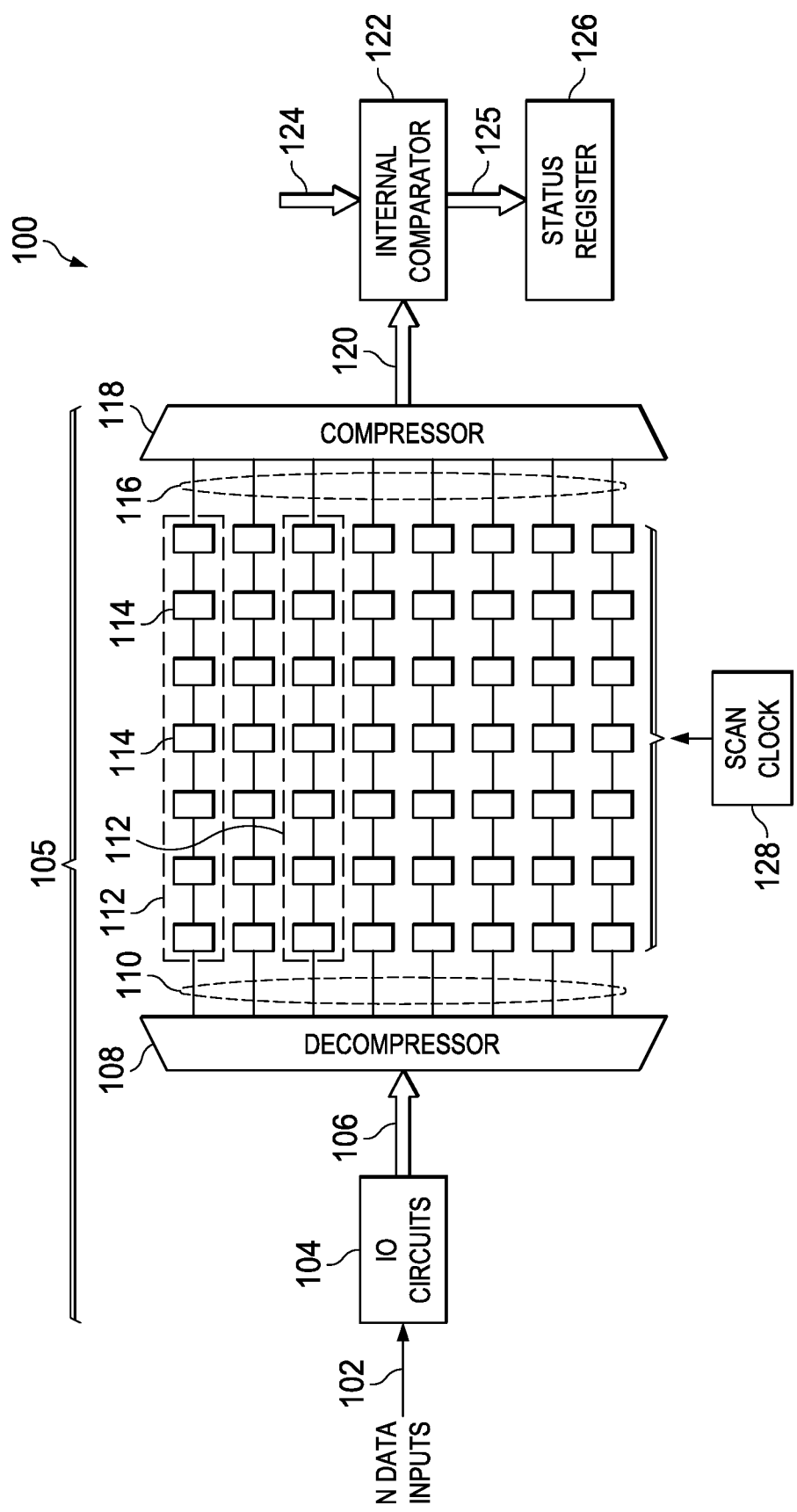
FIG. 1 illustrates a schematic of a circuit for testing an integrated circuit (IC)

FIG. 1 illustrates a schematic of a circuit 100 for testing an integrated circuit (IC). The circuit 100 includes a plurality of IO (input/output) circuits 104, a decompressor 108, a plurality of scan chains 112, a scan clock 128, a compressor 118, an internal comparator 122 and a status register 126. The plurality of IO circuits 104 receives N data inputs 102 from a tester (not illustrated in FIG. 1), where N is an integer. Examples of some testers may include a very low cost tester (VLCT) or high-end testers. The plurality of IO circuits 104 is coupled to the decompressor 108. The decompressor 108 is coupled to the plurality of scan chains 112. Each scan chain of the plurality of scan chains 112 includes a plurality of scan cells for example scan cells 114 illustrated in FIG. 1. The plurality of scan chains 112 is driven by the scan clock 128. The compressor 118 is coupled to the plurality of scan chains 112. The plurality of IO circuits 104, the decompressor 108, the plurality of scan chains 112 and the compressor 118 together form a scan compression architecture 105. The compressor 118 is coupled to the internal comparator 122. The internal comparator 122 receives an expected scan response input 124 from the tester. The status register 126 is coupled to the internal comparator 122.

The operation of the circuit 100 illustrated in FIG. 1 is explained now. The plurality of IO circuits 104 receives N data inputs 102 from the tester and generates N scan inputs 106. The decompressor 108 receives the N scan inputs 106 and generates a plurality of core scan inputs 110 in response to the N scan inputs 106. The plurality of core scan inputs 110 is provided to the plurality of scan chains 112. Each scan cell 114 of the plurality of scan cells shifts a core scan input of the plurality of core scan inputs 110 at a frequency of the scan clock 128. The plurality of scan chains 112 generates a plurality of core scan outputs 116 in response to the plurality of core scan inputs 110 received by the plurality of scan chains 112. The compressor 118 receives the plurality of core scan outputs 116 and generates M scan outputs 120 in response to the plurality of core scan outputs 116, where M is an integer. The internal comparator 122 receives the M scan outputs 120 from the compressor 118. The internal comparator 122 also receives the expected scan response input 124 from the tester. The internal comparator 122 is configured to compare the M scan outputs 120 and the expected scan response input 124 to generate a test result 125. The test result 125 is stored in the status register 126. The status register 126 is capable of storing the test results in the form of one or more bits. Example of status register 126 includes the following, but not limited to, one or more flip-flops such as D flip-flop, or latches. The tester generates a set of bits in each testing cycle which are provided as N data inputs 102 to the scan compression architecture 105 and a plurality of testing cycles constitutes a testing pattern. The test result 125 generated in each testing cycle is stored in the status register 126 and analyzed at the end of each testing pattern.

The internal comparator 122 in some situations also receives unknown values (either '0' or '1') which are termed as masked bits. In such cases, when values in M scan outputs 120 include masked bits, it is excluded from comparison with the expected scan response input 124 by the internal comparator 122. The internal comparator 122 continues to compare the normal logic '1' bits and logic '0' bits that are required for comparison to ascertain the nature (faulty/fault-free) of the integrated circuit which is being tested. However, the use of internal comparator 122 inhibits analysis of test results at the end of each testing cycle and the test results in circuit 100 are analyzed at the end of the testing pattern. Also, the unknown values are needed to be masked in M scan outputs 120 which add an additional overhead per scan output.

Figure 2:
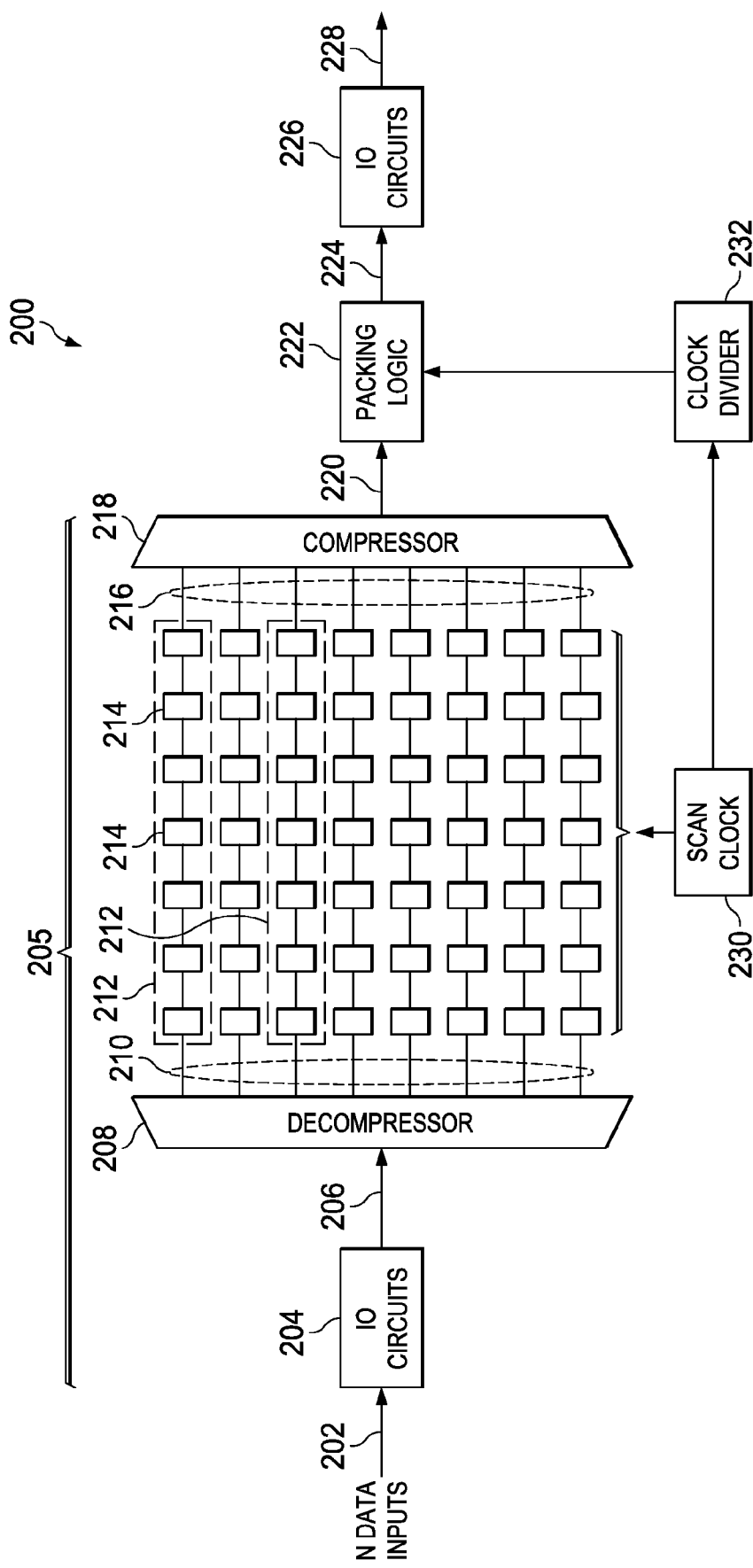
FIG. 2 illustrates a schematic of a circuit for testing an integrated circuit (IC), according to an embodiment.

FIG. 2 illustrates a schematic of a circuit 200 for testing an integrated circuit (IC), according to an embodiment. The circuit 200 includes a first plurality of IO circuits 204, a decompressor 208, a plurality of scan chains 212, a compressor 218, a packing logic 222, a second plurality of IO circuits 226, a scan clock 230 and a clock divider 232. The plurality of IO circuits 204 receives N data inputs 202 from a tester (not illustrated in FIG. 2), where N is an integer. Examples of some testers may include a very low cost tester (VLCT) or high-end testers. The plurality of IO circuits 204 is coupled to the decompressor 208. The decompressor 208 is coupled to the plurality of scan chains 212. Each scan chain of the plurality of scan chains 212 includes a plurality of scan cells for example scan cells 214. The plurality of scan chains 212 is driven by the scan clock 230. The compressor 218 is coupled to the plurality of scan chains 212. The first plurality of IO circuits 204, the decompressor 208, the plurality of scan chains 212 and the compressor 218 together form a scan compression architecture 205. The compressor 218 is coupled to the packing logic 222. The packing logic 222 receives a signal from the clock divider 232. The packing logic 222 is coupled to the second plurality of IO circuits 226.

The operation of the circuit 200 illustrated in FIG. 2 is explained now. The plurality of IO circuits 204 receives N data inputs 202 from the tester and generates N scan inputs 206. The decompressor 208 receives the N scan inputs 206 and generates a plurality of core scan inputs 210 in response to the N scan inputs 206. The plurality of core scan inputs 210 is provided to the plurality of scan chains 212. The plurality of scan chains 212 is driven by the scan clock 230. Each scan cell 214 of the plurality of scan cells shifts a core scan input of the plurality of core scan inputs 210 at a frequency of the scan clock 230. The plurality of scan chains 212 generates a plurality of core scan outputs 216 in response to the plurality of core scan inputs 210 received by the plurality of scan chains 212. The compressor 218 receives the plurality of core scan outputs 216 and generates M scan outputs 220 in response to the plurality of core scan outputs 216, where M is an integer. In one embodiment, M is equal to N. The clock divider 232 is configured to divide the scan clock 230 by k to generate k number of phase-shifted scan clocks, where k is an integer. For example, when frequency of scan clock 230 is 30 MHz, and k is equal to 3, the clock divider generates 3 phase-shifted scan clocks each of 10 MHz. In one embodiment, the phase shift in the scan clocks is a function of k, for example 360°/k. In one embodiment, the phase shift in the scan clocks is 0 degrees i.e. the generated scan clocks are in same phase. The phase-shift in the clocks is predefined by a user and hardwired in the circuit 200. In one embodiment, the clocks are phase shifted by the following, but not limited to, 45, 90 or 180 degrees.

The packing logic 222 is coupled to the scan compression architecture 205 and generates kM slow scan outputs 224 in response to the M scan outputs 220 and k number of phase-shifted scan clocks. The features and operation of the packing logic 222 is further illustrated with the help of FIG. 3 later in the description. The packing logic 222 is coupled to the second plurality of IO circuits 226. The second plurality of IO circuits 226 is configured to generate kM data outputs 228 in response to the kM slow scan outputs 224. The N data inputs 202, the N scan inputs 206 and the M scan outputs 220 operate at a higher frequency as compared to the kM slow scan outputs 224 and kM data outputs 228. Therefore, the circuit 200 addresses the issue of handling kM slow scan outputs 224 even when the M scan outputs 220 are received at a faster rate without any loss of data and in turn saving the time required for testing the integrated circuit. The tester generates a set of bits in each testing cycle which are provided as N data inputs 202 to the scan compression architecture 205 and a plurality of testing cycles constitutes a testing pattern. The packing logic 222 allows analysis of test results at the end of each testing cycle. Also, in situations when packing logic 222 receives unknown values (either '0' or '1') which are termed as masked bits, these masked bits are treated as regular bits and does not add any additional overhead on the circuit 200.

Figure 3:
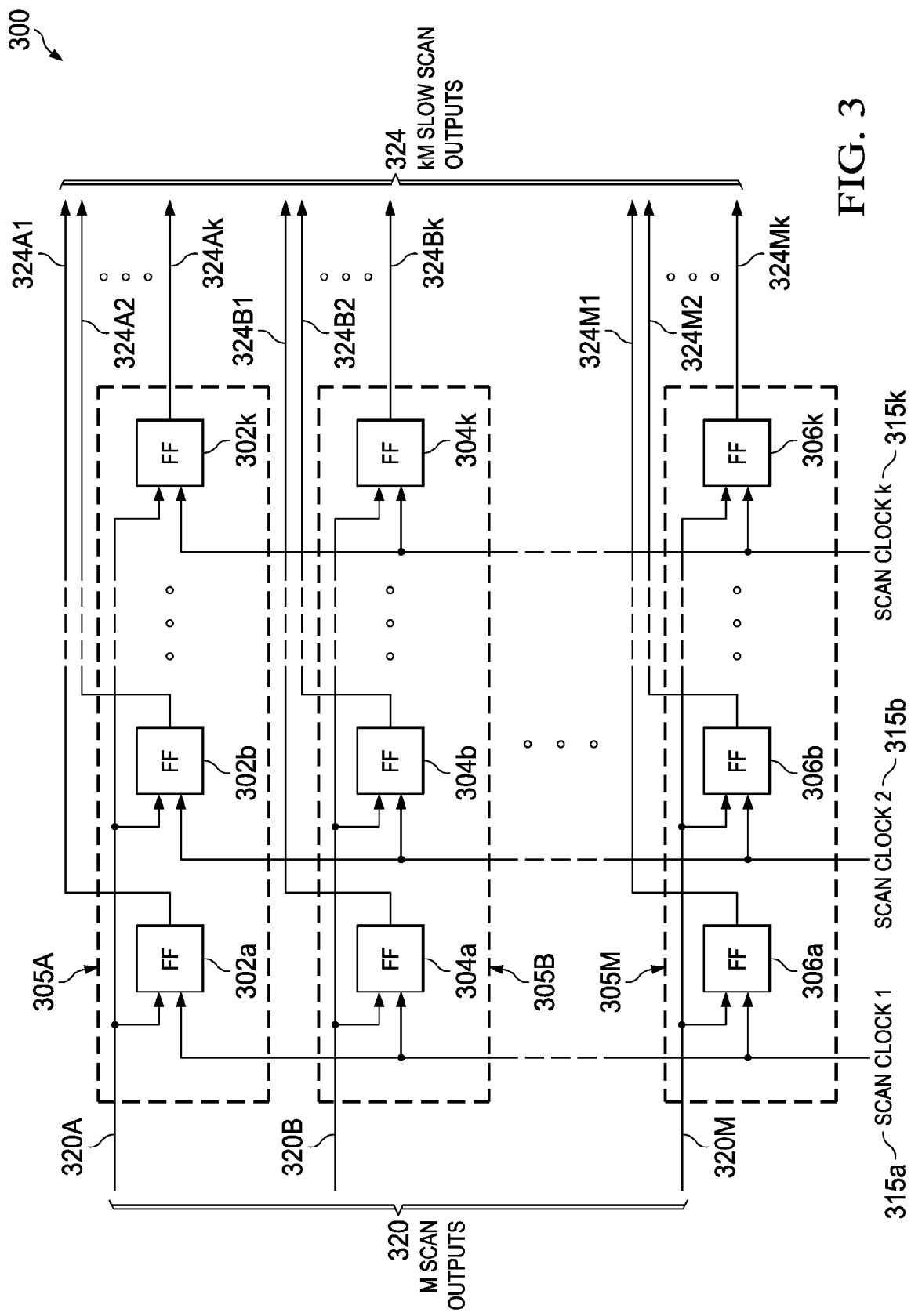
FIG. 3 illustrates a schematic of a packing logic, according to an embodiment.
Figure 4A:
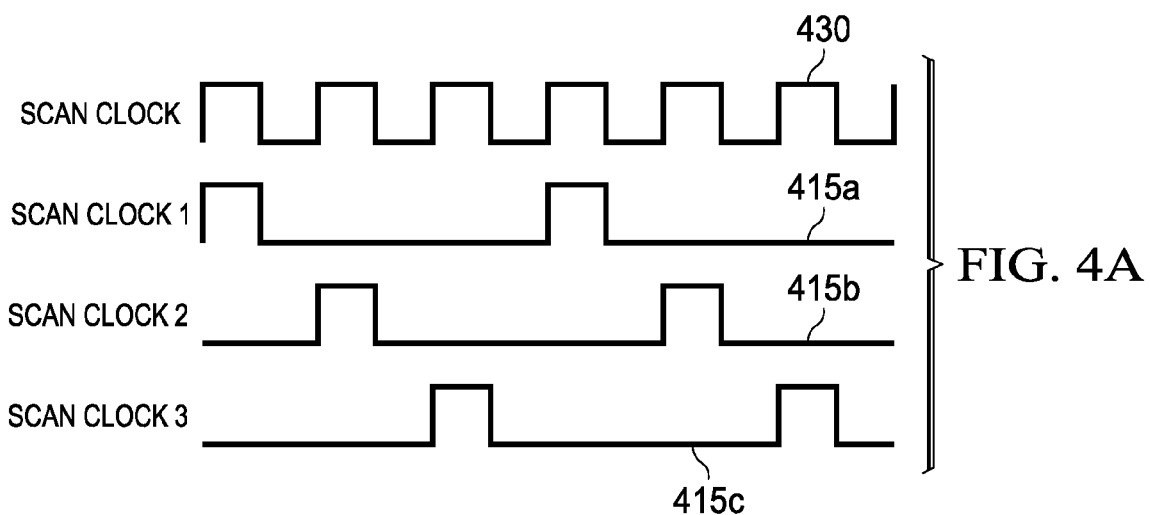
FIG. 4(a) illustrates a timing diagram of a clock divider, according to an embodiment.
Figure 4B:
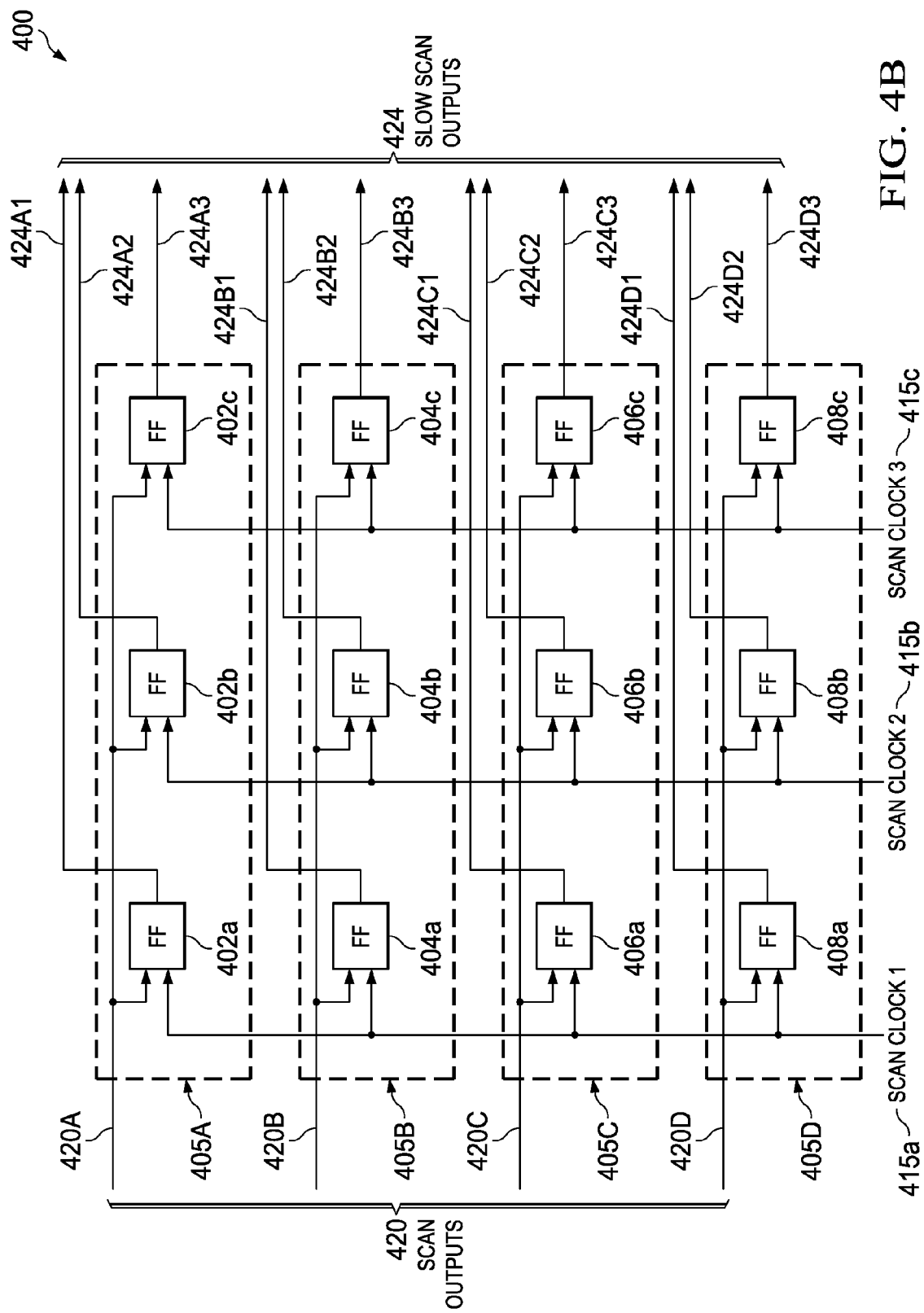
FIG. 4(b) illustrates a schematic of a packing logic, according to an embodiment.

FIG. 3 illustrates a schematic of a packing logic 300, according to an embodiment. The packing logic 300 is similar in connection and operation to the packing logic 222 in the circuit 200. The packing logic 300 includes M number of packing elements (where M is an integer) for example packing elements 305A, 305B and 305M. The packing element 305M is the $M^{th}$ packing element of the M number of packing elements. Each packing element of the M number of packing elements is configured to receive a scan output of M scan outputs 320. For example, the packing element 305A receives a scan output 320A, the packing element 305B receives a scan output 320B and the packing element 305M receives a scan output 320M. The scan output 320M is the $M^{th}$ scan output of the M scan outputs 320. Each packing element includes k number of flip-flops, where k is an integer. For example, the packing element 305A includes flip-flop 302a, 302b and 302k. The flip-flop 302k is the $k^{th}$ flip-flop of the k number of flip-flops. Similarly, the packing element 305M includes flip-flop 306a, 306b and 306k. In one embodiment, the flip-flop is a latch, a combination of flip-flops or a register. The packing logic 300 is configured to receive k number of phase shifted scan clocks from a clock divider (not illustrated in FIG. 3) similar to the clock divider 232 illustrated in FIG. 2. The packing logic 300 receives k phase shifted scan clocks, for example, scan clock 1 (315a), scan clock 2 (315b) and scan clock k (315k). The scan clock k is the kth scan clock of the k phase shifted scan clocks. In one embodiment, the phase shift in the scan clocks is a function of k, for example 360°/k. In one embodiment, the phase shift in the scan clocks is 0 degrees i.e. the generated scan clocks are in same phase. The phase-shift in the clocks is predefined by a user and hardwired in the packing logic 300. In one embodiment, the clocks are phase shifted by the following, but not limited to, 45, 90 or 180 degrees. Each flip-flop of the k number of flip-flops is configured to receive a phase-shifted scan clock of the k number of the phase-shifted scan clocks. For example, flip-flops 302a, 304a and 306a receives scan clock 1 (315a). Similarly the flip-flops 302b, 304b and 306b receives scan clock 2 (315b) and flip-flops 306a, 306b and 306k receives scan clock k (315k). Each flip-flop is configured to generate a slow scan output in response to a scan output and a phase-shifted scan clock. Hence, each packing element generates k slow scan outputs in response to the scan output and the k number of phase-shifted scan clocks. For example, the packing element 305A generates slow scan outputs 324A1, 324A2 and 324Ak, where 324Ak is the $k^{th}$ slow scan output. Similarly, the packing element 305B generates slow scan outputs 324B1, 324B2 and 324Bk, wherein 324 Bk is the $k^{th}$ slow scan output. The packing logic 300 generates kM slow scan outputs 324 in response to the M scan outputs 320. In an embodiment, the packing logic 300 receives two scan outputs and includes two packing element each with two flip-flops. The packing logic therefore generates four slow scan outputs. The operation of packing logic is further illustrated with the help of FIG. 4(*a*) and FIG. 4(*b*).

FIG. 4(*a*) illustrates a timing diagram of a clock divider, according to an embodiment. The figure illustrates the timing diagram when a clock divider, for example clock divider 232 (illustrated in FIG. 2), receives a scan clock (for example scan clock 230) and generates k number of phase-shifted scan clocks, where k is an integer. For the purposes of illustration, and not for the purposes of limitation, the FIG. 4(*a*) illustrates the phase-shifted scan clocks from the clock divider 232, when k is equal to 3. The clock divider is configured to divide the scan clock by k to generate k number of phase-shifted scan clocks. For example, if the frequency of the scan clock is 30 MHz, then the clock divider would generate 3 phase-shifted scan clocks of 10 MHz each. The scan clock 430 is received by the clock divider 232. The clock divider generates 3 phase-shifted scan clocks: scan clock 1 (415a), scan clock 2 (415b) and scan clock 3 (415c). Each scan clock is phase-shifted by (120) degrees. For example, scan clock 2 (415b) is phase-shifted (120) degrees with respect to the scan clock 1 (415a) and similarly, scan clock 3 (415c) is phase shifted (120) degrees with respect to the scan clock 2 (415b). In one embodiment, the phase shift in the scan clocks is a function of k, for example 360°/k. In one embodiment, the phase shift in the scan clocks is 0 degrees i.e. the generated scan clocks are in same phase. The phase-shift in the clocks is predefined by a user and hardwired in the clock divider 232. In one embodiment, the clocks are phase shifted by the following, but not limited to, 45, 90 or 180 degrees.

FIG. 4(*b*) illustrates a schematic of a packing logic 400, according to an embodiment. The packing logic 400 is similar in connection and operation to the packing logic 300. The function of packing logic illustrated in FIG. 4(*b*) is when k is equal to 3 and M is equal to 4. The packing logic 400 includes 4 packing elements (packing elements 405A, 405B, 405C and 405D). The packing logic 400 receives 4 scan outputs which are 420A, 420B, 420C and 420D. Each packing element of the 4 packing elements is configured to receive a scan output of the four scan outputs 420. For example, the packing element 405A receives a scan output 420A, the packing element 405B receives a scan output 420B and the packing element 405D receives a scan output 420D. Each packing element includes 3 flip-flops. For example, the packing element 405A includes flip-flop 402a, 402b and 402c. Similarly, the packing element 405C includes flip-flop 406a, 406b and 406c. In one embodiment, the flip-flop is a latch, a combination of flip-flops or a register. The packing logic 400 is configured to receive 3 phase shifted scan clocks from a clock divider (not illustrated in FIG. 4(*b*)) similar to clock divider 232 illustrated in FIG. 2. The packing logic 400 receives 3 phase shifted scan clocks: scan clock 1 (415a), scan clock 2 (415b) and scan clock 3 (415c) which were illustrated in FIG. 4(*a*). In one embodiment, the phase shift in the scan clocks is a function of k, for example 360°/k. In one embodiment, the phase shift in the scan clocks is 0 degrees i.e. the generated scan clocks are in same phase. The phase-shift in the clocks is predefined by a user and hardwired in the packing logic 400. In one embodiment, the clocks are phase shifted by the following, but not limited to, 45, 90 or 180 degrees. Each flip-flop is configured to receive a phase-shifted scan clock. For example, flip-flops 402a, 404a, 406a and 408a receives scan clock 1 (415a). Similarly the flip-flops 402b, 404b, 406b and 408b receives scan clock 2 (415b) and flip-flops 402c, 404c, 406c and 408c receives scan clock 3 (415c). Each flip-flop is configured to generate a slow scan output in response to a scan output and a phase-shifted scan clock. Hence, each packing element generates 3 slow scan output in response to the scan output and the phase-shifted scan clocks. For example, the packing element 405A generates slow scan outputs 424A1, 424A2 and 424A3. Similarly, the packing element 405B generates slow scan outputs 424B1, 424B2 and 424B3. The packing logic 400 generates 12 (4*3) slow scan outputs 424 in response to the four scan outputs 420.

Figure 5:
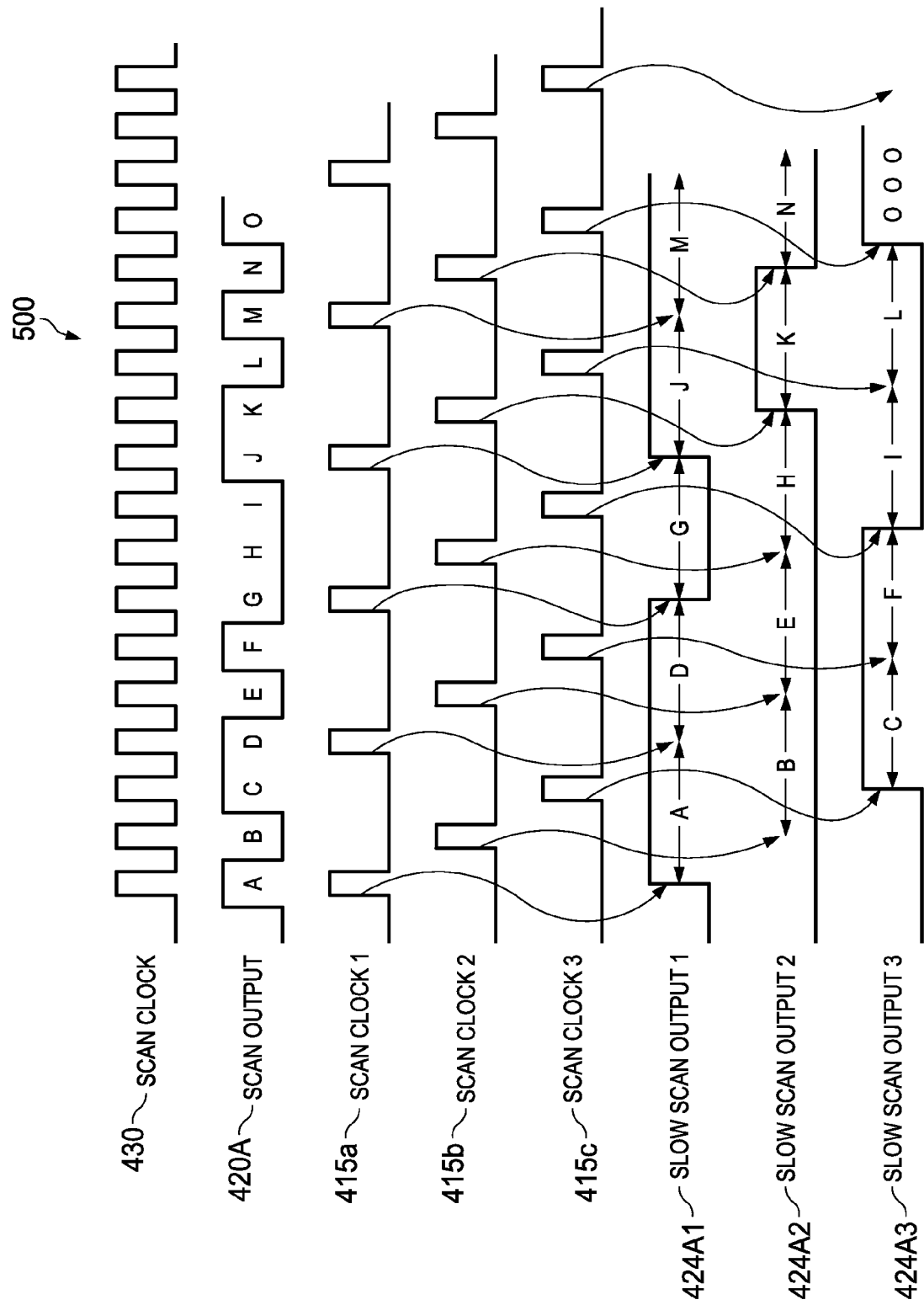
FIG. 5 illustrates a timing diagram of a packing logic, according to an embodiment.

FIG. 5 illustrates a timing diagram 500 of a packing logic, according to an embodiment. For the purpose of ease of understanding, the timing diagram 500 is explained with the help of FIG. 4(*a*) and FIG. 4(*b*) and packing logic 400. For the purposes of illustration, and not for the purposes of limitation, the figure illustrates the phase-shifted scan clocks and the slow scan outputs, when k is equal to 3 and M is equal to 4. The figure illustrates the timing diagram 500 when a clock divider, for example clock divider 232 (illustrated in FIG. 2), receives a scan clock 430 and generates 3 phase-shifted scan clocks: scan clock 1 (415a), scan clock 2 (415b) and scan clock 3 (415c). The generation of scan clocks is similar to the one explained in FIG. 4(a) and is not explained here for the sake of brevity of description. The packing element 405A receives the scan output 420A. The timing diagram 500 illustrates, 3 slow scan outputs which are being generated by a packing element for example packing element 405A in the packing logic 400 (illustrated in FIG. 4(b)). The flip-flop 402a receives the scan clock 1(415a) and the scan output 420A and generates a slow scan output 1 (424A1). Similarly, the flip-flop 402b generates a slow scan output 2 (424A2) in response to the scan clock 2(415b) and the scan output 420A. Also, the flip-flop 402c generates a slow scan output (424A3) in response to the scan clock 3(415c) and the scan output 420A. The timing diagram 500 further illustrates that for one scan output, the packing element generates three slow scan outputs. It is seen that the scan output 420A is received by the packing logic 400 at the frequency of the scan clock 430 whereas the slow scan outputs (424A1-424A3) are generated at a frequency which is one-third of the frequency of the scan clock 430. Thus, each slow scan output is available as an output of the packing logic 400 for 3 pulses of the scan clock 430. Thus, the packing logic 400 allows analysis of test results at the end of each pulse of clock cycle. The test results at the end of each pulse of clock cycle enables diagnosis of failing scan chain. Therefore, the packing logic 400 addresses the issue of handling 12 slow scan outputs even when the 4 scan outputs are received at a faster rate without any loss of data and in turn saving the time required for testing an integrated circuit.

Figure 6:
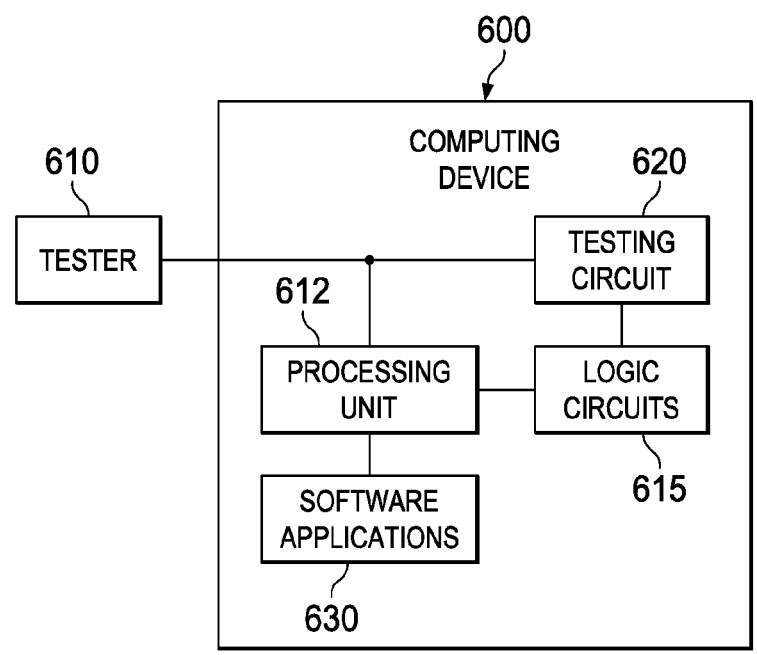
FIG. 6 illustrates a computing device according to an embodiment.

FIG. 6 illustrates a computing device 600 according to an embodiment. The computing device 600 is, or is an integrated circuit incorporated into, a server farm, a computing device with hard-drive, a video recorder, a bluetooth device, a remote control, a keyboard, a mobile communication device, such as a mobile phone, a personal digital assistant, a personal computer, or any other type of electronic system.

In some embodiments, the computing device 600 can be one of, but not limited to, microcontroller, microprocessor or a system-on-chip (SoC) which includes a processing unit 612 such as a CPU (Central Processing Unit). The processing unit 612 can be, for example, a CISC-type (Complex Instruction Set Computer) CPU, RISC-type CPU (Reduced Instruction Set Computer), or a digital signal processor (DSP). A tester 610 is coupled to the computing device 600. The tester 610 comprises logic that supports testing and debugging of the computing device 600 executing the software applications 630. For example, the tester 610 can be used to emulate a defective or unavailable component(s) of the computing device 600 to allow verification of how the component(s), were it actually present on the computing device 600, would perform in various situations (e.g., how the component(s) would interact with the software applications 630). In this way, the software applications 630 can be debugged in an environment which resembles post-production operation.

The processing unit 612 typically comprises cache-memory and logic which store and use information frequently accessed from the tester 610 and is responsible for the complete functionality of the computing device 600. The computing device 600 includes a plurality of logic circuits 615. At least one logic circuit of the plurality of logic circuits 615 is coupled to a testing circuit 620. The testing circuit 620 is analogous to the circuit 200 in connection and operation. The testing circuit works in conjunction with the tester 610. The testing circuit 620 addresses the issue of handling kM slow scan outputs even when the M scan outputs are received at a faster rate without any loss of data and in turn saving the time required for testing the integrated circuit, where k, M and N are integers. The tester 610 generates a set of bits in each testing cycle which are provided as N data inputs to the testing circuit 620 and a plurality of testing cycles constitutes a testing pattern. The testing circuit 620 allows analysis of test results at the end of each testing cycle. Also, in situations when testing circuit 620 receives unknown values (either '0' or '1') which are termed as masked bits, the testing circuit 620 treats them as regular bits. Thus, the testing circuit 620 does not add any additional overhead on the computing device 600.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. A circuit comprising:
   a scan compression architecture driven by a scan clock and configured to generate M scan outputs, where M is an integer greater than or equal to one;
   a clock divider configured to divide the scan clock by k to generate k number of phase-shifted scan clocks, where k is an integer greater than or equal to one; and
   a packing logic coupled to the scan compression architecture and configured to generate kM slow scan outputs in response to the M scan outputs and k number of phase shifted scan clocks, wherein the packing logic comprises:

M number of packing elements, each packing element configured to receive a scan output of the M scan outputs; and k number of flip-flops in each packing element, each flip-flop of the k number of flip-flops in a packing element configured to receive a scan output of the M scan outputs and configured to receive a phase-shifted scan clock of the k number of phase-shifted scan clocks, such that each flip-flop generates a slow scan output in response to the scan output and the k number of phase-shifted scan clocks.

2. The circuit of claim 1, wherein each packing element generates k slow scan outputs in response to the scan output and the k number of phase-shifted scan clocks.

3. The circuit of claim 1, wherein the scan compression architecture further comprises:
a first plurality of input/output (IO) circuits configured to receive N data inputs and configured to generate N scan inputs, where N is an integer greater than or equal to one;
a decompressor coupled to the first plurality of IO circuits and configured to receive the N scan inputs;
a compressor coupled to the decompressor and configured to generate the M scan outputs; and
a plurality of scan chains coupled between the decompressor and the compressor, wherein each scan chain of the plurality of scan chains comprises a plurality of scan cells.

4. The circuit of claim 1 further comprising a second plurality of IO circuits coupled to the packing logic and configured to generate kM data outputs in response to the kM slow scan outputs.

5. The circuit of claim 1, wherein the plurality of scan chains is driven by the scan clock.

6. The circuit of claim 1, wherein the decompressor is configured to generate a plurality of core scan inputs in response to the N scan inputs.

7. The circuit of claim 1, wherein the plurality of scan chains is configured to receive the plurality of core scan inputs, wherein each scan cell of the plurality of scan cells is configured to shift a core scan input of the plurality of core scan inputs at a frequency of the scan clock.

8. The circuit of claim 1, wherein the plurality of scan chains is configured to generate a plurality of core scan outputs in response to the plurality of core scan inputs.

9. The circuit of claim 1, wherein the compressor is configured to generate the M scan outputs in response to the plurality of core scan outputs.

10. A method of testing an integrated circuit, comprising:
a first step of generating M scan outputs from N data inputs, where M and N are integers greater than or equal to one, and wherein the N data inputs are a set of bits generated in each testing cycle of the integrated circuit;
a second step of generating k number of phase-shifted scan clocks from a scan clock, where k is an integer greater than or equal to one;
a third step of configuring a packing logic to generate kM slow scan outputs from the M scan outputs, wherein the packing logic comprises M number of packing elements; and
a four step of configuring each packing element of the M number of packing elements to generate k slow scan output in response to a scan output of the M scan outputs and the k number of phase-shifted scan clocks;
wherein the kM slow scan outputs are an output of the test;
wherein testing of the integrated circuit is performed by the first, second, third and fourth steps.
wherein the M scan outputs are an output of the test.

11. The method of claim 10, wherein generating M scan outputs from N data inputs comprises:
generating N scan inputs in response to the N data inputs;
generating a plurality of core scan inputs in response to the N scan inputs;
generating a plurality of core scan outputs in response to the plurality of core scan inputs; and
generating the M scan outputs in response to the plurality of core scan outputs.

12. The method of claim 10, wherein each packing element comprises k number of flip-flops.

13. The method of claim 10 further comprising configuring each flip-flop of the k number of flip-flops in a packing element to generate a slow scan output in response to the scan output received at the packing element and to a phase-shifted scan clock of the k number of phase-shifted scan clocks.

14. The method of claim 10 further comprising a plurality of scan chains configured to generate a plurality of core scan outputs in response to the plurality of core scan inputs, each scan chain of the plurality of scan chains comprises a plurality of scan cells.

15. The method of claim 10, wherein each scan cell of the plurality of scan cells is configured to shift a core scan input of the plurality of core scan inputs at a frequency of the scan clock.

16. The method of claim 10 further comprising generating kM data outputs in response to the kM slow scan outputs.

17. A computing device comprising:
a processing unit;
a plurality of logic circuits coupled to the processing unit; and
a testing circuit coupled to at least one logic circuit of the plurality of logic circuits, the testing circuit comprising:
a scan compression architecture driven by a scan clock and configured to generate M scan outputs, where M is an integer greater than or equal to one;
a clock divider configured to divide the scan clock by k to generate k number of phase-shifted scan clocks, where k is an integer greater than or equal to one; and
a packing logic coupled to the scan compression architecture and configured to generate kM slow scan outputs in response to the M scan outputs and k number of phase shifted scan clocks, wherein the packing logic comprises:
M number of packing elements, each packing element configured to receive a scan output of the M scan outputs; and
k number of flip-flops in each packing element, each flip-flop of the k number of flip-flops in a packing element configured to receive a scan output of the M scan outputs and configured to receive a phase-shifted scan clock of the k number of phase-shifted scan clocks, such that each flip-flop generates a slow scan output in response to the scan output and the k number of phase-shifted scan clocks.

18. The computing device of claim 17, wherein the scan compression architecture further comprises:
a first plurality of input/output (10) circuits configured to receive N data inputs and configured to generate N scan inputs, where N is an integer greater than or equal to one;
a decompressor coupled to the first plurality of 10 circuits and configured to receive the N scan inputs;
a compressor coupled to the decompressor and configured to generate the M scan outputs; and a plurality of scan chains coupled between the decompressor and the compressor, wherein each scan chain of the plurality of scan chains comprises a plurality of scan cells.

19. The computing device of claim 17 further comprising a second plurality of IO circuits coupled to the packing logic and configured to generate kM data outputs in response to the kM slow scan outputs.

20. The computing device of claim 17, wherein the plurality of scan chains is configured to receive the plurality of core scan inputs, wherein each scan cell of the plurality of scan cells is configured to shift a core scan input of the plurality of core scan inputs at a frequency of the scan clock.

* * * * *